United States Patent [19]
Kubota et al.

[11] Patent Number: 5,807,440
[45] Date of Patent: Sep. 15, 1998

[54] PHOTOVOLTAIC DEVICE

[75] Inventors: Yuichi Kubota, Chiba; Kazuo Nishi, Kanagawa, both of Japan

[73] Assignees: Semiconductor Energy Laboratory Co., Ltd., Kanagawa-ken; TDK Corporation, Tokyo, both of Japan

[21] Appl. No.: 664,434

[22] Filed: Jun. 18, 1996

[30] Foreign Application Priority Data

Jun. 20, 1995 [JP] Japan ................................. 7-176799

[51] Int. Cl.$^6$ ...................... H01L 31/0232; H01L 31/04
[52] U.S. Cl. ...................... 136/256; 136/257; 136/259; 257/432; 257/435
[58] Field of Search ...................... 136/256, 257, 136/259; 257/432, 435

[56] References Cited

U.S. PATENT DOCUMENTS 5,421,909  6/1995  Ishikawa et al. ..................... 136/256

FOREIGN PATENT DOCUMENTS

| 60-148172 | 8/1985 | Japan | 136/257 |
| 60-148173 | 8/1985 | Japan | 136/257 |
| 60-148174 | 8/1985 | Japan | 136/257 |
| 63-17342 | 4/1988 | Japan . | |
| 2-94575 | 4/1990 | Japan . | |
| 7-30225 | 4/1995 | Japan . | |
| 7-29646 | 7/1995 | Japan . | |

*Primary Examiner*—Nam Nguyen
*Attorney, Agent, or Firm*—Fish & Richardson P.C.

[57] ABSTRACT

A photovoltaic device is provided which can selectively and stably control the color of an intended exterior surface, particularly a light-incident surface side, of the photovoltaic device, and which exhibits high performance. A diffuser layer is provided on a light incident plane side of the photovoltaic device for scattering and dispersing incident light. By providing a coloring layer thereon to color incident light or using a structure where the diffuser layer itself is colored, reduction of photoelectromotive force performance is minimized while adding color to the photovoltaic device.

21 Claims, 2 Drawing Sheets

PHOTOVOLTAIC DEVICE

BACKGROUND OF THE INVENTION

The present invention relates to a technique of coloring the exterior of a light incident side of a photovoltaic device in which photoelectromotive force is generated by the incidence of sunlight or the like.

FIG. 2 shows a conventional photovoltaic device. A normal photovoltaic device of the prior art typically has a structure wherein, as shown in FIG. 2, a rear surface electrode 22, a photovoltaic layer 23 such as a PIN junction amorphous semiconductor layer or the like, a transparent conductive film 24, and a translucent protection film 25 for preventing intrusion of moisture etc. are sequentially deposited on a glass or organic resin substrate 21.

As one method for coloring the photovoltaic device, adding a colorant or pigment to the translucent protection film 25 covering the transparent conductive film 24 of the photovoltaic device of the structure described above to form a coloring layer is described in Published Unexamined Japanese Patent Application No. 2-94575 and the like.

However, due to the optical interference of the transparent conductive film, unintended colors appear, and moreover tones change significantly due to slight differences in film thickness in the transparent conductive film.

In order to suppress these significant changes in tone due to the transparent film, it is necessary to include an equivalent amount of colorant or pigment in the translucent protection film when the photovoltaic device is colored, to form a coloring layer.

As a result, the interruption and absorption of incident light becomes pronounced and the photoelectric conversion efficiency of the photovoltaic device is greatly reduced due to the colorant or pigment in the coloring layer.

Also, when colorant or pigment is added to the coloring layer it is difficult to add pale tones. Since the tones of interfering light from the transparent conductive film and reflected light, etc. from the transparent conductive film and the photovoltaic layer are strong, such pale tones are negated.

SUMMARY OF THE INVENTION

The, present invention has as its object to provide a photovoltaic device which can optionally and stably control the color of an intended exterior face, particularly a light-incident surface side, of the photovoltaic device, and which exhibits high performance. Specifically, these objects are as follows:

1. To provide a structure of a photovoltaic device in which the inclusion of colored components, i.e. colorants, pigments or dyes, in the photovoltaic device is greatly reduced, and which can optionally and stably control the color of the desired exterior face. Thereby, the interruption and absorption of incident light due to colored components is reduced, photoelectric conversion efficiency and photo-electromotive force, which are the most significant characteristics of a photovoltaic device, are improved, and a balance between tone maintenance and performance of the photovoltaic device can be devised.

2. To produce subtle tints such as light tints and neutral tints as they were intended. To achieve a photovoltaic device which makes possible designs, letters and the like and which is extremely attractive in appearance.

3. To achieve a colored photovoltaic device which has the desired tone, flexibility, and lightness.

To achieve the above objects, the structure of the present invention has a diffuser layer on a light incident plane side of the photovoltaic device for scattering and dispersing incident light.

Also, another structure of the present invention has a diffuser layer on a light incident plane side of the photovoltaic device for scattering and dispersing incident light and a coloring layer on the diffuser layer for coloring incident light.

Further, another structure of the present invention has at least a substrate, a rear surface electrode, a photovoltaic layer and a transparent conductive film, and comprises a diffuser layer on a light incident plane side of the photovoltaic device for scattering and dispersing incident light and a coloring layer on the diffuser layer for coloring incident light. In this structure, the substrate and the rear surface electrode may also be translucent.

Further still, another structure of the present invention has at least a substrate, a rear surface electrode, a photovoltaic layer, a transparent conductive film, and an auxiliary electrode and comprises a diffuser layer on the transparent conductive film and the auxiliary electrode for scattering and dispersing incident light and a coloring layer on the diffuser layer for coloring incident light, wherein the surface of the auxiliary electrode on the light incident plane side is black or a color similar to black.

In each of the structures of the present invention described above, the substrate used may also be a flexible substrate. Also, in each of the structures of the present invention described above, the coloring layer used may also be formed by a translucent protection film which includes a colorant, pigments, or dye.

A diffuser in which a colorant or pigment from white to near-colorless is uniformly dispersed within a translucent resin may also be used as the diffuser layer of the above photovoltaic device.

Also, the diffuser layer may also be a porous resin layer provided with a large number of minute holes within a translucent resin.

Further, the diffuser layer may be one in which a resin component insoluble with a translucent resin component is uniformly dispersed in minute particles within a translucent resin.

Moreover, each of the above diffuser layers has a haze characteristic of from 15 to 90%, a total light beam transmissivity of from 20 to 90%, a total reflectivity of 10 to 60%, and a diffused reflectivity of 5 to 50%.

Another structure of the present invention is a photovoltaic device which has a diffuser layer which colors incident light and scatters and disperses the incident light, provided on a light incident plane side of the photovoltaic device. In this structure the diffuser layer used may also include a colored colorant, pigment, or dye.

In the present invention, to solve the foregoing problem, a photovoltaic device has a diffuser layer for scattering and dispersing incident light moderately in the course of the incident light between a transparent conductive film such as ITO and a coloring layer for coloring the incident light, the coloring layer being made from a translucent protection film including a coloring component such as a colorant, pigment, or dye in a transparent resin.

The basic structure of the present invention is shown in FIG. 1. In FIG. 1, a rear surface electrode 2, a photovoltaic layer 3, a transparent conductive film 4 are deposited on a glass or organic resin substrate 1, and a diffuser layer 5 and coloring layer 6 are provided thereupon.

The diffuser layer does not allow all of the transmitted light having spectra of various colors and passing through the coloring layer deposited on the upper portion thereof to be transmitted as it is, but scatters/disperses a part thereof. As a result, the tone of colored light can be strengthened.

Further, a phenomenon wherein the scattered/dispersed part is further strengthened by being returned to the coloring layer after being transmitted once then multiplex reflected, occurs.

Also, by providing a diffuser layer, light incident on the photovoltaic device attains a screening effect with respect to fluctuations in coloring and tone due to optical interference, which occurs due to the thickness of the ITO etc. transparent conductive film, and reflected light from the amorphous silicon etc. photovoltaic layer, which occur due to the thickness of the ITO etc. transparent conductive film. Accordingly, changes in tone due to optical interference and reflected light can be prevented.

Consequently, by means of a structure utilizing a diffuser layer, while the color components such colorants, pigments, and dyes which are included in the coloring layer have a much lower inclusion rate than in the prior art, the desired tone can be further ensured over prior art cases of utilizing a coloring layer alone. In particular, the present invention is remarkably effective in maintaining tone of light color.

Also, in the diffuser layer when considering the occurrence of a slight reduction in incident light due to scattering, reduction of the amount of incident light in light reaching the photovoltaic layer is very small compared to a case where a conventional coloring layer of the same tone is used. Thereby, deterioration of the I-V characteristic and photoelectric conversion characteristic accompanying coloring can be suppressed to a minimum.

In other words, in a conventional method using only a coloring layer, in order to attain a tone equivalent to that of the present invention, the addition of further colored components is necessary. In such a case, due to this excessive addition of colored components, the amount of light reaching the photovoltaic layer decreases and the I-V characteristic of the photovoltaic device is deteriorated in the extreme owing to the screening and absorption of the incident light.

As preferred characteristics, the diffuser layer of the present invention is effective where, based on JIS-K-7361, the haze (cloudiness value: H%) value is from 15 to 90%, total light beam transmissivity (Tt%) is from 20 to 90%, total reflectivity is from 10 to 60%, and diffused reflectivity is from 5 to 50%.

As even more preferable optical characteristics, the diffuser layer is extremely effective when the haze value is from 65 to 89%, total light beam transmissivity is from 45 to 83%, total reflectivity is from 18 to 43%, and diffused reflectivity is from 15 to 40%.

These optical characteristic values of the diffuser layer effectively make use of the spectral sensitivity characteristic of the photovoltaic device, particularly an amorphous silicon photovoltaic device, effectively generate tones from short wavelengths in the vicinity of blue to long wavelengths in the vicinity of red and are extremely effective optical conditions for bringing forth a good balance between both the performance of the photovoltaic device and its coloring ability.

In the diffuser layer, if the haze value is over 15%, or more preferably over 65%, its light diffusing effect is high until incident light reaches the transparent conductive film and the amorphous silicon film and the tone of the coloring layer is sufficiently realized. This suppresses reflected light exhibiting magenta due to interference by the transparent conductive film and the red-brown of the amorphous silicon film, whose tones are even stronger, and can prevent a reduction in color purity. If the haze value is less than 15%, the intended color becomes essentially unattainable.

However, as the haze value is greater than 90%, the dispersed light increases. Because of the increase of the dispersion light, the total light beam transmissivity becomes decreases significantly, photoelectric conversion efficiency decreases, and becomes incapable of supporting a photovoltaic device. If the haze value is less than 90%, or more preferably less than 89%, while the incident light is sufficiently diffused by the diffuser layer, the amount of light reaching the photovoltaic layer can be sufficiently maintained and reduction of photoelectric conversion efficiency can be minimized.

As for total light transmissivity, where it is 20% or higher, or more preferably 45% or higher, the amount of light reaching the photoelectric conversion layer can be maintained, and in particular where it is 45% or higher, photoelectric current attenuation can be kept to 50% or less of that where a diffuser layer is not used, and a high performance photovoltaic device can be attained.

Where the total light transmissivity is less than 20%, the functions of a photovoltaic device cannot be achieved. However, where total light transmissivity is higher than 90%, diffused light transmissivity decreases greatly; therefore it cannot function as a diffuser layer and has a tendency to make coloring difficult.

Where total light transmissivity is 90% or lower, or more preferably 83% or lower, since diffused light transmissivity can be sufficiently maintained and a colored photovoltaic device attained, the functions of a diffuser layer are achieved.

With regard to reflectivity (at 45° incident light), with total reflectivity preferably from 10% to 60%, most preferably from 15% to 43%, and diffused reflectivity preferably from 5 to 50%, most preferably 18 to 43%, loss of incident light due to reflection can be prevented and color can be effectively generated by the coloring layer. In a diffuser layer having total reflectivity of more than 60% and diffused reflectivity of more than 50%, loss of light due to reflection at the diffuser layer prior to the incident light reaching the photoelectric conversion layer is great and photoelectric conversion efficiency is greatly reduced. Also, where total reflectivity is below 10% and diffused reflectivity is below 5%, part of the incident light is repeatedly diffusely reflected within the diffuser layer, color generation by the coloring layer cannot be sufficiently achieved, reflected light of dark colors of strong tones from the transparent conductive film and the amorphous silicon layer cannot be screened, and deterioration of color purity becomes extreme.

Thus, it is preferable for the diffuser layer to have the above optical characteristics in order to achieve a colored photovoltaic device which has clearer tones and keeps the reduction of photoelectromotive force to a minimum.

The diffuser layer used in the present invention has the characteristics described above, and is adjusted not to disperse or scatter, too much, the incident light which has passed through diffusion, and is adjusted so as to not greatly reduced total light transmissivity.

In the present invention, can employ any composition as the structure of the diffuser layer so long as it satisfies the above-described conditions. Any material which has high transmissivity to light and a light diffusing property may be used. As an example of a material with high transmissivity, glass, organic resin, ceramic, or the like may be used.

In particular, as organic resins, polystyrene and its derivatives, polyethylene, acrylic, methacrylic and their derivatives, unsaturated polyester, polyvinyl formal, polyvinyl acetal, polycarbonate, norvolnene, saturated polyester, liquid crystal polymer, polyethylene terephthalate, polyethylene naphthalate, polyphenylene sulphide, polyether ethylketone, urethane, epoxy, phenoxy, alamide, polyimide and their derivatives, etc. each as single components or as compounds or mixtures are representative.

Where an organic resin is used as the diffuser layer as described above, a diffuser layer which has flexibility compared to where glass or a ceramic is used, it is an inexpensive material so manufacturing costs are low, it is light weight, a roll-to-roll process or other mass-production method can be used so production efficiency is high, it resists impact, is easy to laminate on a photovoltaic device by a laminating process and achieves other excellent effects, and thus is very advantageous.

Where a flexible substrate of organic resin or the like is used as the substrate of the photovoltaic device, the following are particularly effective as the structure of the diffuser layer.

(1) A resin layer including colorants of white or near-colorless minute particles in small amounts in a uniformly distributed state is used. As the white or near-colorless minute particle colorants, silicon oxide, alumina, calcium carbonate, barium sulphate, titanium oxide, clay, etc. are representative. This resin layer has its thickness controlled to match the desired total reflectivity and total transmissivity.

(2) A curing agent such as particulate thermal expansion microcapsules are mixed in a suitable amount with a melt or solvent of a transparent resin which is transparent or a color close to white, this is heated to a desired temperature and cured, and results in a porous resin layer having microscopic pores and is used as the diffuser layer. In this case, the pores pierce the resin layer, and alternatively they need not completely pierce the layer. Also, the distribution, diameter, porosity of the pores and film thickness are adjusted to match the desired total reflectivity and total transmissivity.

(3) A mixed resin layer of two or more types of resin which are transparent or a color close to white is used as the diffuser layer, the tropism of the types differing greatly and having inferior compatibility (the resins are insoluble with each other). For example, the layer is produced by mixing, in a transparent resin, a resin which is insoluble with the transparent resin. Also, the volumetric proportion and film thickness of the resin layer are adjusted to match the desired total reflectivity and total transmissivity.

The thickness of the diffuser layer is not specifically limited. If the diffuser layer is made thick, although the photoelectric conversion characteristic of the photovoltaic device is reduced because total light transmissivity and diffused light transmissivity decrease, total reflectivity and diffuse reflectivity increase so the brightness and color of tones are improved. Accordingly, the film thickness of the diffuser layer is determined by a balance between the desired tone, photoelectromotive force, diffuser layer characteristics, etc.

When constructing the color photovoltaic device, the diffuser layer itself may be colored by the inclusion of colored components therein to function as a coloring layer. Also, the diffuser layer not only may be provided in contact with the transparent conductive film, electrode, protection layer, substrate, etc. of the photovoltaic device, but may also be provided separately therefrom. In addition, a structure wherein an auxiliary electrode of aluminum or silver is provided on the transparent conductive film of the photovoltaic device to improve the conductivity of the transparent conductive film is known. However, where the diffuser layer and coloring layer are provided on the surface where the auxiliary electrode is provided, because the auxiliary electrode is visible from the upper surface due to the strong reflectivity of the auxiliary electrode, the appearance thereof is unacceptable.

Given this, the surface on the light incident side of the auxiliary electrode is made black or a color close to black such as brown, red or any other color which has a high visible light absorption coefficient, and by reducing the amount of reflection of light, or by making the surface on the light incident side of the auxiliary electrode a color which emits reflective light close to the light reflected from the photovoltaic layer or transparent conductive film, when seen from above, the existence of the auxiliary electrode is not perceived and a uniform color can be attained.

In order to make the surface on the light incident surface side of the auxiliary electrode black or a color close to black, a black coating may be painted on the auxiliary electrode, or a black material, for example conductive carbon black or the like, may be included in the material forming the auxiliary electrode, for example silver paste, to make the auxiliary electrode itself black. In particular, if it is a conductive material such as conductive carbon black, by coloring it black, reduction of the conductivity of the auxiliary electrode can be minimized, therefore this is preferred.

Also, the rear surface electrode of the photovoltaic device may be made of a transparent conductive film such as ITO or the like, and may have a see-through structure which imparts transmissivity on both electrodes sandwiching the photovoltaic layer and imparts transmissivity on the substrate, the diffuser layer and coloring layer being provided on at least one surface on either the substrate side or the side opposite the substrate, or both sides, to produce a colored see-through photovoltaic device. Further, when coloring the substrate side, colored components may be included in the substrate itself to make it a coloring layer. Moreover, the substrate itself may serve as the diffuser layer or both the diffuser layer and the coloring layer together, by using a substrate with light diffusability.

Further still, in the present invention, the coloring layer need not impart coloring of only one color, but if the coloring layer were given a structure where a number of colors are coated on the transparent protection film which is colorless and transparent, by screen printing or the like for example, a photovoltaic device having multi-colored maps, drawings, letters, etc. in optional ways with favorable tones can be attained.

By means of the present invention, a colored photovoltaic device can be achieved which has high a photoelectromotive force characteristic while retaining the intended color tones. In particular, pale and intermediate colors and the like can be used to color light to the intended colors.

Also, because flexibility can be achieved, a flexible photovoltaic device using an organic resin substrate can be given an optional color tone.

By means of the present invention, because a colored photovoltaic device can be achieved which has an optional color tone and a free design, excellent fashionable products utilizing a photovoltaic device, such as a card calculator, clock or watch having a photovoltaic device can be provided.

BRIEF DESCRIPTION OF THE DRAWINGS

These and other features, aspects and advantages of the present invention will become better understood with reference to the following description, appended claims and accompanying drawings, wherein:

DETAILED DESCRIPTION OF THE INVENTION

Embodiment 1

In the first embodiment, a photovoltaic device was produced using polyethylene naphthalate having flexibility as the substrate.

In fabricating this photovoltaic device, firstly an amorphous silicon film as a photovoltaic layer and an ITO transparent conductive film are deposited on the rear surface electrode.

Then, the diffuser layer is deposited on the ITO conductive film and a coloring layer having a desired color tone was deposited on the topmost portion to obtain a photovoltaic device.

When forming this colored photovoltaic device, deposition and lamination were performed by an in-line roll-to-roll process.

Figure 1:
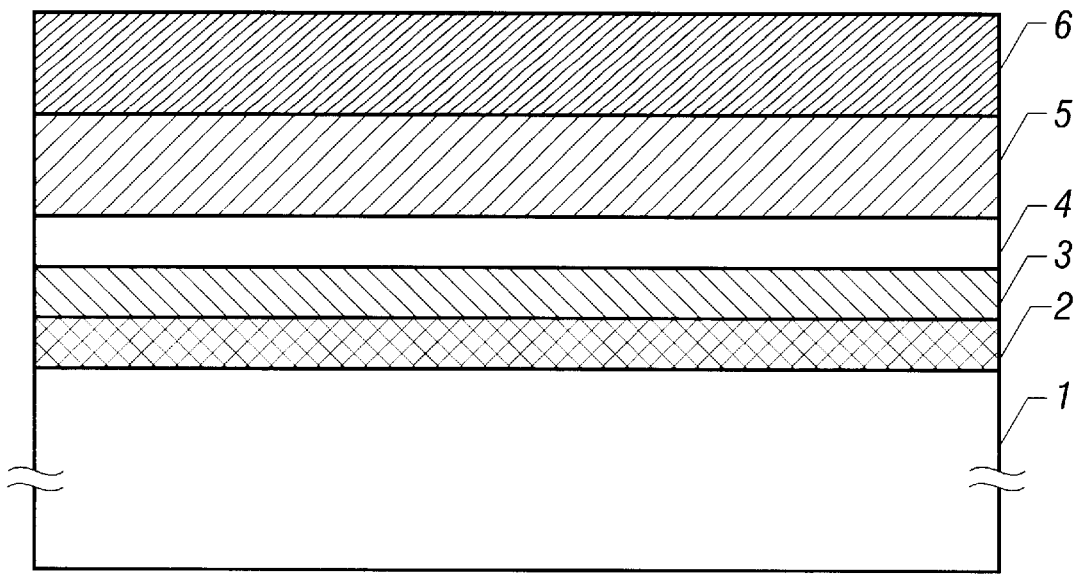
FIG. 1 shows the basic structure of the present invention.
Figure 2:
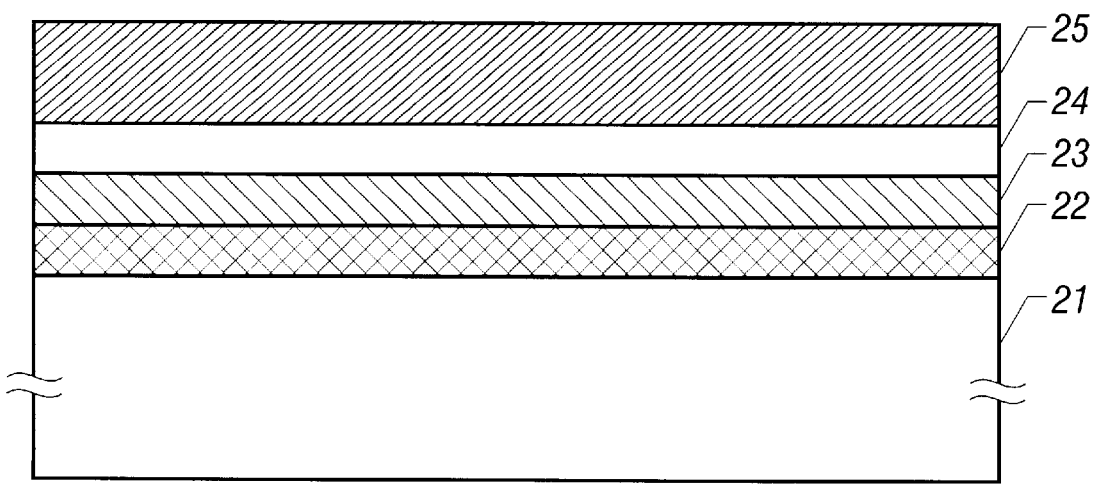
FIG. 2 shows a conventional photovoltaic device.
Figure 3A:
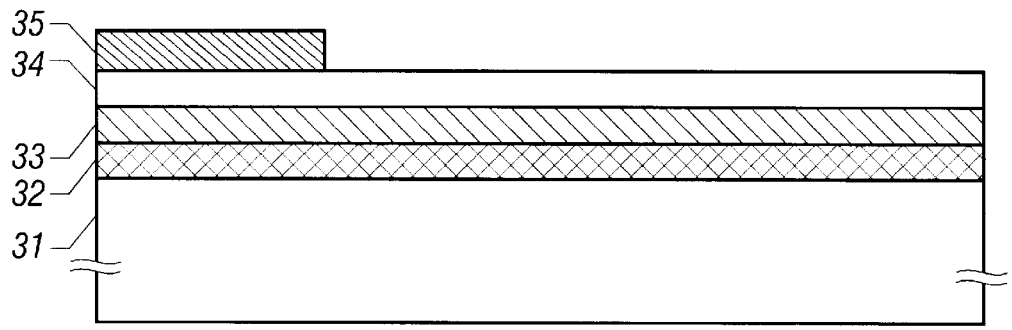
FIG. 3 shows the fabrication steps of Embodiment 1.
Figure 3B:
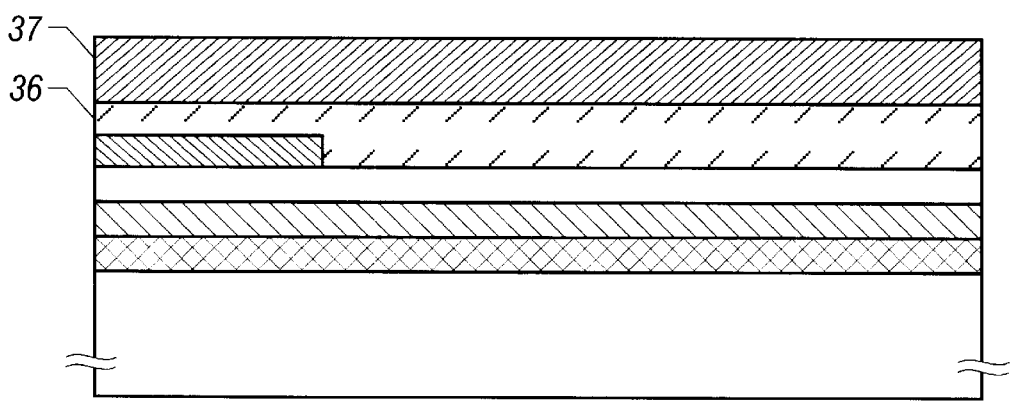
Figure 3C:
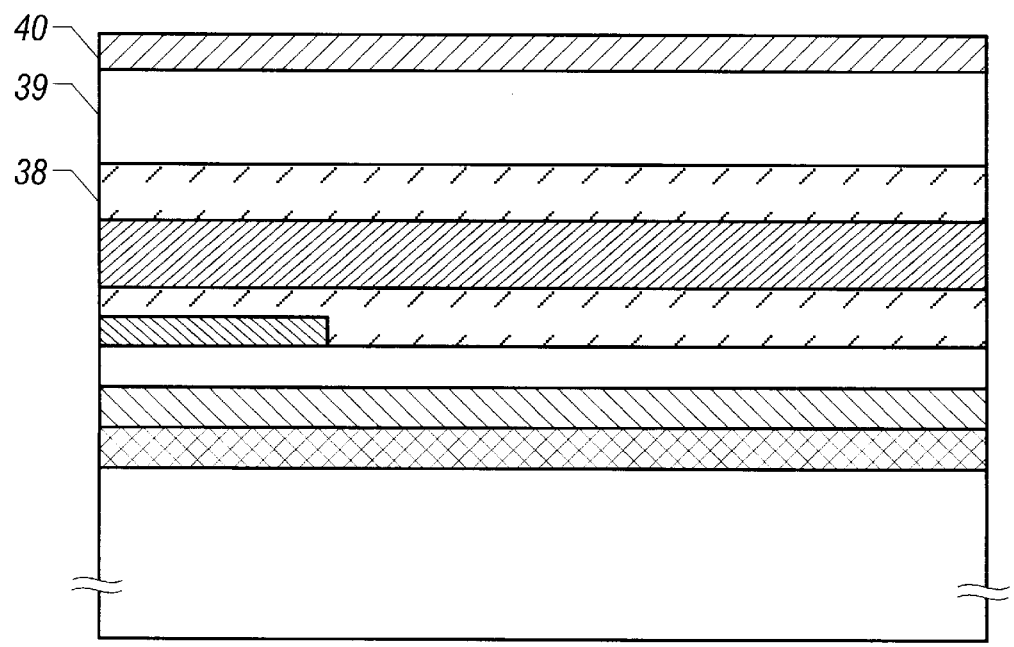

FIG. 3 shows the fabrication steps of the first embodiment.

Firstly, as shown in FIG. 3(A), an electrode 32 comprising aluminum or a deposited film of aluminum and stainless steel formed on a flexible substrate 31 formed from polyethylene naphthalate.

Next, as the photovoltaic layer 33, an amorphous silicon layer having a PIN junction is formed by a plasma CVD process.

Then the ITO transparent conductive film 34 is formed on the photovoltaic layer 33 by an Ar gas sputtering method on the photovoltaic layer 33 using an ITO (indium tin oxide) target.

A silver (Ag) paste with carbon black added thereto is coated onto the ITO transparent conductive film 34 by a screen printing method as the auxiliary electrode 35.

In these steps, a YAG laser or the like is used and precise minutely detailed processing such as forming grooves and perforation holes for insulation or electrical contact is performed to form a flexible photovoltaic device.

Next, the diffuser layer 37 is deposited on a light incident surface (on the ITO transparent conductive film) of the device.

Here, the diffuser layer 37 is deposited by a laminating process at 110° C. using a heat sensitive bonding agent 36 and a ethylene/vinyl acetate copolymer resin film of 20 μm thickness.

A diffuser layer 37 which itself has a bonding property with respect to the ITO transparent conductive film 34 and the auxiliary electrode 35 may be used without using the heat sensitive bonding agent 36.

Here, as the diffuser layer 37, a film 50 μm thick with indeterminate-shaped silicon oxide of approximately 4 μm average particle diameter, mixed and distributed at 1.5 Wt % in a melted polyethylene terephthalate resin, is used. This film has a surface roughness (Ra) of 350 nm, and the values of white light transmissivity/optical diffusion characteristics (JIS regulation K7361) are total light transmissivity (Tt): 72.4%, diffuse light transmissivity (Td): 55.6%, haze value (cloudiness value Td/Tt): 76.7%, total reflectivity (Rt): 30.9% and diffuse reflectivity (Rd): 25.0% (measurement results where measured with a C light source using a haze/transmissivity/reflectivity measuring unit HR-100 by Murakami Color Technology Research Laboratories. Reflectivities Rt and Rd were measured with 45° incident light).

Next, the coloring layer which is the topmost layer is formed under the following conditions. The coloring layer is formed by providing a green resin composition 40 on a polyethylene terephthalate film 39, and also functions as a protection film.

The green resin composition 40 is colored by a green phthalocyanine colorant and is a polyurethane type thermosetting resin composition. Specifically, it is as follows.

Phenoxy resin (made by UCC, PKHH): 20 parts by weight

Solvent-cyclohexanone: 200 parts by weight

Colorant-phthalocyanine green 6YS (made by Sanyo Pigments Corp.): 0.2 parts by weight Dispersant (oleic acid): 3 parts by weight Levelling agent (made by Shinetsu Silicon Corp., KS-66): 1 part by weight In fabricating the coloring layer, the phenoxy resin is completely dissolved in a solvent (cyclohexanone) and is dispersed for 48 hours together with the pigment and dispersant by a zirconia ball mill.

Next, the levelling agent was added to the solvent and mixed for a further two hours. And to this mixture there was added 17 parts by weight of isocyanurate-bonded hexamethylene diisocyanate (HDI trimer) as a non-yellowing hardner, so that both contents of a hydroxide group and isocyanate group of a phenoxy resin were in chemically equivalence, and after mixing for 20 minutes, a resin composition was obtained.

This resin composition was formed into a polyethylene terephthalate resin film 39 with a thickness of 50 μm by a photogravure lacquering method so that the thickness of the green resin composition 40 was 5 μm.

The green coloring layer formed in this way was deposited on the diffuser layer 37 by means of a laminating process using the heat-sensitive bonding agent 38. Needless to say, the green coloring layer may be formed in a single layer of only a translucent resin containing a pigment or colorant. Also, the bonding method is optional. Thus, a green-colored color photovoltaic device was produced.

The various characteristics of the green-colored color photovoltaic device produced in the present embodiment are as follows.

Photoelectromotive force characteristic

The attenuation of the short-circuit current value after the coloring layer (with diffuser layer and coloring layer) is 42% compared with the short-circuit current value (Isc) prior to the coloring layer (diffuser layer, no coloring layer). With regard to this, in order to produce an equivalent color tone to the photovoltaic device produced in Embodiment 1 without using the diffuser layer, where the colorant in the green resin composition forming the coloring layer is increased to 2.0 parts by weight to produce the photovoltaic device, the attenuation of the short-circuit current after coloring (coloring layer alone) is 96% with respect to the short-circuit current prior to coloring, so that the functions of the photovoltaic device generally cannot be expected.

Color tone

Regarding the green-colored photovoltaic device fabricated in Embodiment 1, a measured color value was obtained by a spectrophotometer (measured by high speed spectrophotometer CMS-35SP produced by Murakami Color Technology Research Laboratories).

From optical diffusion measurement based on JIS-Z-8722, representative values measured using a green photovoltaic device where a diffuser layer was used were color of 5.6 times and brightness of 2.0 times the case where the same coloring layer was used without a diffuser layer, resulting in an extremely clear green color.

Moisture resistance

By lamination of the diffuser layer and the coloring layer formed by a polyethylene terephthalate and urethane type resin composition, solar battery characteristic deterioration was not exhibited when stored for more than 2,000 hours at 80° C. and 90% RH, achieving high moisture resistance.

Heat resistance

An insulating protection film portion is also formed by means of a thermosetting urethane type coating around the periphery of the electrodes for 15° C. rises in Tg and bringing into contact FPCs or lead wires etc., thus changes in "solderability" and thermo compression bonding, thermal deformation, inadequate insulation and an unsatisfactory appearance did not occur.

Also, because the auxiliary electrode 35 is black, the appearance of the photovoltaic device is as preferred, without the auxiliary electrode being visible from the light incident surface side by the transparency.

Embodiment 2

In the second embodiment, as the diffuser layer, an example of a porous resin layer having microscopic pores formed by mixing a suitable amount of particulate thermal expansion microcapsules or the like into a solvent of translucent resin which is transparent or close to white and curing it at a predetermined temperature will be shown. The diffuser layer is fabricated by the materials and method set forth below.

Firstly, polymethyl methacrylate resin (Taisei Kako Co., Ltd., polymerization degree 20,000) at 50 parts by weight, polybutyl methacrylate resin (Taisei Kako Co.,Ltd., polymerization degree 20,000) at 20 parts by weight and ½ second cellulose acetate butyrate resin (Produced by Eastman Kodak: CAB 381-0.5) at 30 parts by weight are dissolved in 300 parts by weight of ethyl acetate to produce 25 weight % of mixed resin lacquer.

Matsumoto microsphere particles, made by Matsumoto Yushi (F-80GSD, acrylonitrile copolymer microcapsules including hexane therein, average diameter 5 $\mu$m) are added at 50 parts by weight, sufficiently dispersed for 2 hours at 1,000 rpm using a homomixer (made by Tokushu Machine Industries), then defoamed.

This mixture is coated onto a 70 $\mu$m thick polyester film by a doctor blade coating method and, after drying in a drying oven at 120° C., a 25 $\mu$m polyester film is laminated thereon at 80° C., and is rolled out after passed in a 170° C. heating oven by one minute. The polyester film is peeled off from the rolled-out roll to obtain a foam film 40 $\mu$m thick.

This film is a white porous film containing many air bubbles of 10 to 30 $\mu$m diameter, has a structure wherein portions where the pores pass through the film and portions where the pores are enclosed within the film are included therein, the air hole volume being 35%. Because it is a porous film, the surface is roughened due to the air bubbles, the optical diffusion characteristics by measurement under JIS-K-7361 being Tt: 78.5%, Td: 62.2%, haze value (Td/Tt): 79.2%, Rt: 28.3%, Rd: 24.1%.

Upon producing a photovoltaic device having this film as the diffuser layer and the rest manufactured as per Embodiment 1, extremely favorable color tones can be achieved as compared with the photovoltaic device having the same structure except for where the diffuser layer is not used, and short-circuit current can be limited to a range sufficiently practical for a photovoltaic device.

Embodiment 3

In Embodiment 3, an example using a sheet (made by NITTO DENKO CORPORATION) of macromolecular polyethylene of average molecular weight of approximately 1×10$^5$ and which has been made porous is used as the diffuser layer. This sheet is 100 $\mu$m thick, has a porosity of 40% and an average pore diameter of approximately 30 $\mu$m, and is white. The optical diffusion characteristics of this sheet Tt: 76.3%, Td: 61.4%, haze value: 80.5%, Rt: 30.7% and Rd: 26.8%.

Upon producing a photovoltaic device having this sheet deposited on the ITO transparent conductive film by being laminated directly thereonto as the diffuser layer and the rest having a structure the same as that manufactured in Embodiment 1, extremely favorable color tones can be achieved as compared with the photovoltaic device having the same structure except for where the diffusion layer is not used, and short-circuit current can be limited to a range sufficiently practical for a photovoltaic device.

In this photovoltaic device, the diffuser layer itself has the function of coloring incident light and a function of diffusing and dispersing incident light.

Also, this white sheet and the same sheet colored with a green color or orange color (each 100 $\mu$m thick) are deposited by being laminated directly onto the ITO transparent conductive film as the diffuser layer by a heat-sensitive bonding agent to produce a white, green, and orange colored photovoltaic device, and together with the photovoltaic device prior to laminating, without the sheet, was subjected to color measurement under JIS-Z-8722 and the condition that specular reflected light not be included (measured by high speed spectrophotometer CMS-35SP produced by Murakami Color Technology Research Laboratories).

The actual measurement values of the results of these measurements are shown in Table 1.

TABLE 1

| Sample | Luminosity (L*) | Chroma (C*ab) | Hue (H*ab) | Is attenuation |
|---|---|---|---|---|
| Without sheet | 21.4 | 8.01 | 313.8° | 0% |
| White | 60.3 | 3.47 | 282.8° | 32% |
| Green | 61.7 | 12.47 | 187.5° | 36% |
| Orange | 40.9 | 26.23 | 52.7° | 36% |

As shown in Table 1, favorable color tones were achieved by each colored sheet, and it can be seen that the photovoltaic device is colored thereby.

Regarding luminosity (L*), a photovoltaic device in which the amorphous silicon layer (or ITO transparent conductive film) exhibits dark colors is colored and the color tone of the sheet is ensured.

Regarding chroma (C*ab) , the chroma value of each color tone was obtained.

Regarding hue (H*ab), a photovoltaic device having each of the hues of white, green, and orange was obtained from the dark magenta color metal gloss hue of the original photovoltaic device.

Also, attenuation of Is (short-circuit current), with a photovoltaic device without the sheet provided as a reference, was 32% for white and 36% for both green and orange, achieving both coloring and favorable performance for a photovoltaic device.

By utilizing this sheet as the diffuser layer, the photovoltaic device is effective in obtaining pale pastel color tones.

Note that the present invention is not limited to the above-described embodiments and drawings and various modifications may be made without departing from the scope thereof.

What is claimed is:

1. A photovoltaic device comprising a diffuser layer on a light incident plane side of the photovoltaic device for scattering and dispersing incident light, said diffuser layer comprising a porous resin layer.

2. The device of claim 1 wherein the diffuser layer has a haze characteristic of from 15 to 90%, a total light beam transmissivity of from 20 to 90%, a total reflectivity of 10 to 60%, and a diffuse reflectance of 5 to 50%.

3. A photovoltaic device comprising:
   a diffuser layer comprising a porous resin layer on a light incident plane side of the photovoltaic device for scattering and dispersing incident light; and
   a coloring layer on the diffuser layer for coloring incident light.

4. The device of claim 3 wherein the coloring layer is produced by a translucent protection film which includes a colorant, pigment, or dye.

5. The device of claim 3 wherein the diffuser layer is a porous resin layer provided with a large number of minute holes within a translucent resin.

6. The device of claim 3 wherein the diffuser layer has a haze characteristic of from 15 to 90%, a total light beam transmissivity of from 20 to 90%, a total reflectivity of 10 to 60%, and a diffuse reflectance of 5 to 50%.

7. A photovoltaic device comprising:
   a translucent substrate,
   a translucent rear surface electrode, coupled to said translucent substrate;
   a transparent conductive film coupled to said photovoltaic layer;
   a photovoltaic layer coupled to said transclucent rear surface electrode;
   a diffuser layer on a light incident plane side of the photovoltaic device for scattering and dispersing incident lights said defuser layer being coupled to said transparent conductive film; and
   a coloring layer on the diffuser layer operating to color incident light.

8. The device of claim 7 wherein the substrate is a flexible substrate.

9. The device of claim 7 wherein the coloring layer is produced by a translucent protection film which includes a colorant, pigment, or dye.

10. The device of claim 7 wherein the diffuser layer is one in which a colorant or pigment from white to near-colorless is uniformly dispersed within a translucent resin.

11. The device of claim 7 wherein the diffuser layer is a porous resin layer provided with a large number of minute holes within a translucent resin.

12. The device of claim 7 wherein the diffuser layer is one in which a resin component which is insoluble in a translucent resin component is uniformly dispersed in minute particles within said translucent resin.

13. The device of claim 7 wherein the diffuser layer has a haze characteristic of from 15 to 90%, a total light beam transmissivity of from 20 to 90%, a total reflectivity of 10 to 60%, and a diffuse reflectance of 5 to 50%.

14. The device of claim 7 wherein the substrate and the rear surface electrode have translucence.

15. A photovoltaic device having in sequence at least a substrate, a rear surface electrode, a photovoltaic layer, a translucent conductive film, and an auxiliary electrode, wherein:
   a surface on a light incident side of the auxiliary electrode is black or a color similar to black; and
   the photovoltaic device further comprises a diffuser layer on the translucent conductive film and the auxiliary electrode for scattering and dispersing incident light, and a coloring layer on the diffuser layer for coloring incident light.

16. The device of claim 15 wherein the substrate is a flexible substrate.

17. The device of claim 15 wherein the coloring layer is produced by a translucent protection film which includes a colorant, pigment)or dye.

18. The device of claim 15 wherein the diffuser layer is one in which a colorant or pigment from white to near-colorless is uniformly dispersed within a translucent resin.

19. The device of claim 15 wherein the diffuser layer is a porous resin layer provided with a large number of minute holes within a translucent resin.

20. The device of claim 15 wherein the diffuser layer is one in which a resin component insoluble in a translucent resin component is uniformly dispersed in minute particles within said translucent resin.

21. The device of claim 15 wherein the diffuser layer has a haze characteristic of from 15 to 90%, a total light beam transmissivity of from 20 to 90%, a total reflectivity of 10 to 60%, and a diffuse reflectance of 5 to 50%.

* * * * *